Figure 1:
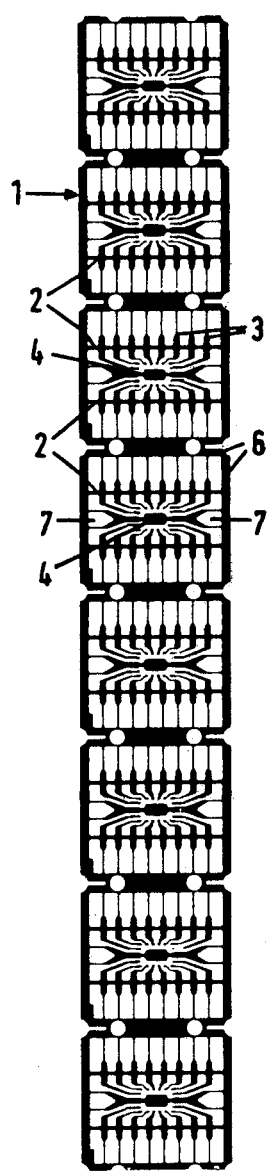

United States Patent [19]

Fierkens

[11] 4,250,347
[45] Feb. 10, 1981

[54] METHOD OF ENCAPSULATING MICROELECTRONIC ELEMENTS

[76] Inventor: Richardus H. J. Fierkens, Keurbeek 15, Herwen, Netherlands

[21] Appl. No.: 899,340

[22] Filed: Apr. 24, 1978

[30] Foreign Application Priority Data

May 5, 1977 [NL] Netherlands ............... 7704937

[51] Int. Cl.³ ............................................. H05K 5/00
[52] U.S. Cl. ..................... 174/52 PE; 29/588; 174/52 FP; 357/72; 264/272
[58] Field of Search ............. 174/52 PE, 52 FP; 264/272; 29/588, 627; 357/72

[56] References Cited

U.S. PATENT DOCUMENTS

| | | | |
|---|---|---|---|
| 3,086,149 | 4/1963 | Baron | 357/72 X |
| 3,251,015 | 5/1966 | Denham | 174/52 PE X |
| 3,469,684 | 9/1969 | Keady et al. | 174/52 FP X |
| 3,778,685 | 12/1973 | Kennedy | 174/52 FP X |
| 3,838,316 | 9/1974 | Brown et al. | 29/627 X |
| 3,868,725 | 2/1975 | De Graff | 174/52 FP X |
| 4,066,839 | 1/1978 | Cossutta et al. | 174/52 FP X |

Primary Examiner—B. A. Reynolds
Assistant Examiner—D. A. Tone
Attorney, Agent, or Firm—LeBlanc, Nolan, Shur & Nies

[57] ABSTRACT

Method for encapsulating microelectronic elements, starting from strip-like material including a number of interconnected conductor patterns each having a number of leads for the microelectronic element to be encapsulated, which comprises applying a microelectronic element or crystal in the center of each conductor pattern, the terminal means of which are connected to the leads of the conductor pattern, after which the crystal-carrying strip-like material is so positioned in a mould that each crystal is substantially in the center of a mould cavity, which cavity is subsequently poured with an encapsulating synthetic material, wherein on each crystal-carrying conductor pattern on either side of the strip-like material a mould half provided with an aperture is placed in such a manner that the two apertures together form the mould cavity for the encapsulating material, the two mould halves serving as a permanent encapsulation for the crystal after pouring of the mould cavity.

5 Claims, 6 Drawing Figures

METHOD OF ENCAPSULATING MICROELECTRONIC ELEMENTS

The present invention relates to a method of encapsulating microelectronic elements, starting from strip-like material including a number of interconnected conductor patterns each having a number of leads for the micro-electronic element to be encapsulated, which comprises providing a microelectronic element or crystal in the centre of each conductor pattern, the terminal means of the element or crystal being connected to the leads of the conductor pattern, after which the crystal-carrying strip-like material is positioned in a mould so that each crystal is substantially in the centre of a mould cavity, which cavity is subsequently poured with an encapsulating synthetic material.

Such a method is known from actual practice and is generally used for encapsulating microelectronic elements. The encapsulation is effected in moulds which usually contain optimally about 15-20 strips of seven to twelve conductor patterns. The size of the mould cannot be increased without limitation. The maximum sizes are substantially determined by the maximum path which encapsulating material poured in the mould can traverse through usually narrow channels. This encapsulating material is a very special synthetic material, usually indicated by EPOXY by skilled workers, which material is highly stable, has to cure rapidly and may absolutely not shrink, because this would break the leads of the crystals, which leads are usually formed of gold wires, during curing of the encapsulating material. The EPOXY should also be highly viscous, because the method is to be carried out at low injection pressure in the mould.

The known method comprises successively the introduction of the strips in the mould, closing the mould, pouring the mould cavities present therein and solidifying the EPOXY, after which the mould can be opened and the strips with encapsulated crystals are removed. As the encapsulating material can contaminate the mould, the latter has first to be cleaned before new strips can be introduced. Consequently, the known method is a discontinuous process, in which a certain series of crystals is encapsulated simultaneously. The cycle duration is rather long, about 2 or 3 minutes. Moreover a very expensive mould has to be used and the production process cannot possibly be automated. Further this method requires much expensive encapsulating material, because a mould "tree" is present, while the amount of EPOXY for each encapsulated crystal is determined by the standardized outside dimensions of the element and not by the amount necessary for encapsulating the crystal and its leads.

The object of the invention is to remove these disadvantages and to provide a method which is characterized in that on each crystal-carrying conductor pattern on either side of the strip-like material an apertured mould half is placed in such a manner that the two apertures together form the mould cavity for the encapsulating material, the two mould halves serving as a permanent enclosure for the crystal after pouring of the mould cavity.

The method according to the invention has the advantage that the expensive moulds can be abandoned. In lieu thereof, considerably simpler and less expensive moulds can be used for injection moulding the mould halves, which moulds can moreover be larger, that is, can have more mould cavities. Moreover the method according to the invention has the advantage that the manufacturing process can be automated, while owing to the permanent enclosure of the crystal by the mould halves less encapsulating material needs to be used.

To simply fit the mould halves one of these mould halves is preferably provided at two ends with projecting pins which are inserted through corresponding apertures in each conductor pattern, while the other mould half is provided with apertures which snap about the pins projecting through the conductor pattern.

The external shape of the mould halves can in principle be chosen freely. Preferably, however, the external dimensions of the composite mould on each conductor pattern are equal to current international standards for encapsulated microelectronic elements, while the aperture in each mould half is spherical both in longitudinal and in cross section, the arrangement being such that the encapsulating material to be injected into the mould cavity can be limited to an amount sufficient to encapsulate the crystal and its connection to the leads.

An automated process for encapsulating crystals is characterized, according to the present invention, in that the strip-like material with crystals is fed from a reel or in the form of cut strips from a feed container to a station for fitting the two mould halves, is subsequently passed along an injection moulding device substantially comprising one or more injection nozzles placed at the pitch distance of the conductor patterns, for injecting the encapsulating material into the moulds, after which the strip-like material with the poured mould halves run through a heating furnace, if necessary, and are subsequently wound on a reel or placed in a container. Other operations, such as cutting out and/or bending the products from the strip can be performed directly after the encapsulation, likewise in line.

Moreover the present invention provides a microelectronic element substantially comprising a crystal surrounded by encapsulating material having outwardly projecting leads, which element is characterized in that the external enclosure of the crystal consists of two interconnected hollow elements separated by the leads, which hollow elements are of a material other than the encapsulating material, while within this enclosure an amount of encapsulating material directly surrounding the crystal and its connection to the leads is present.

Figure 2:
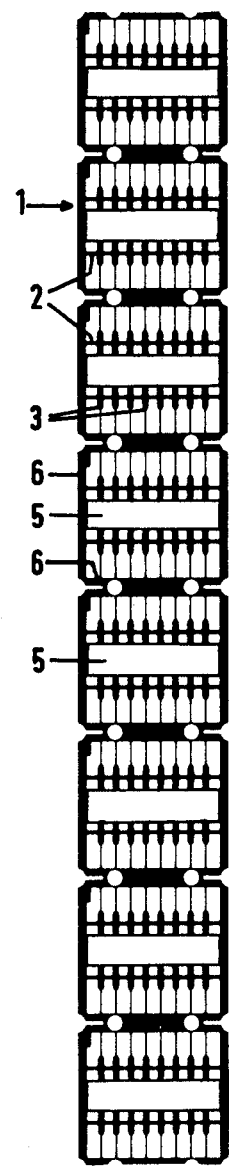
Figure 3:
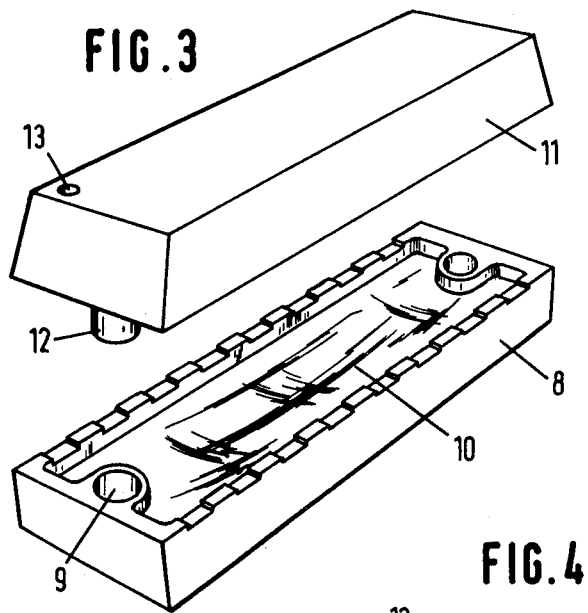
Figure 4:
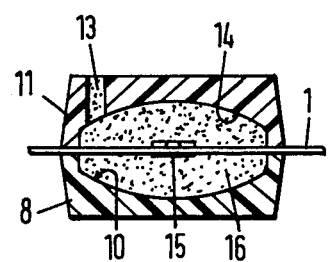
Figure 5:
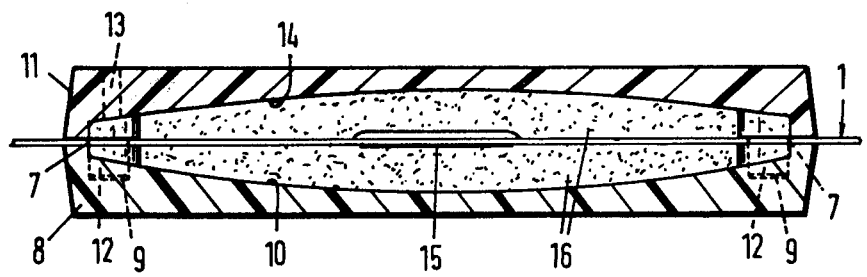
Figure 6:
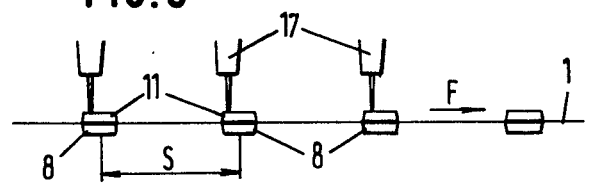

The method and the microelectronic element according to the invention will be explained in more detail with reference to the drawings in which FIG. 1 shows the strip-like starting material for applying both the known method and that according to the invention, FIG. 2 shows the strip of FIG. 1, but provided with encapsulated crystal elements, FIG. 3 shows the mould halves used in the method according to the invention, FIG. 4 is a cross-sectional view through the mould of FIG. 3, FIG. 5 is a longitudinal view through the mould of FIG. 3, FIG. 6 shows schematically an automated process for encapsulating crystals.

In FIG. 1 reference numeral 1 shows a length of strip-like material, including interconnected conductor patterns 2, each having a number of terminal means 3 for including a crystal in a circuit arrangement, which crystal is placed in the centre 4 of conductor pattern 2 and of which crystal the leads are connected to terminal means 3.

FIG. 2 shows the strip 1 of FIG. 1, including a number of encapsulated crystal elements 5. After encapsulation of the crystals the edge 6 of each conductor pattern is removed and the microelectronic element remains as it can be used in circuit arrangements.

FIG. 3 indicates the assembly consisting of two mould halves, as used in the method according to the invention. The lower mould half 8 includes a mould cavity 10, while on both ends apertures are provided which can snap about pins 12 of the upper mould half 11. Moreover a pouring aperture 13 is provided in the upper mould half 11. It will be clear that the upper mould half 11 also includes a mould cavity similar to mould cavity 10. The projecting pins 12 are arranged in the upper mould half so as to project through apertures 7 in conductor pattern 2, as shown in FIG. 1. The two mould halves 8, 11 are placed on each conductor pattern 2 of the strip-like material 1, after the crystals on this strip-like material have been placed in the centre 4 and have been connected with their leads to terminal means 3 of the conductor pattern 2. Through the pouring opening 13 the mould cavity surrounded by the two mould halves is then poured or injected with encapsulating material.

FIG. 4 is a cross-sectional view of an encapsulated crystal manufactured by applying the method according to the invention. The upper and lower mould halves are fitted on either side of strip 1 in a manner described above. The external dimensions of the elements formed from strip 1 and the two mould halves 8, 11 have the external dimensions corresponding with obtaining international standards. In the prior art method the complete section would consist of encapsulating material 16, whereas in the method according to the invention only part of this section comprises the expensive encapsulating material 16 and the remainder of the section is occupied by the less expensive synthetic material of the two mould halves 8, 11.

FIG. 5 is a longitudinal sectional view of the mould halves 8, 11 on the strip-like material. This drawing shows the shape of mould cavities 10 and 14, while FIG. 5 also shows the amount of encapsulating material 16 that can be saved by applying the method according to the invention. It is clear that crystal 15 with its leads is sufficiently encapsulated and that the remainder of the section is occupied by the material of the two mould halves 8, 11.

FIG. 6 shows schematically an automated process for encapsulating crystals. A number of mould halves 8, 11 is pressed on the strip-like material 1 in a manner indicated above. The strip-like material is advanced in the direction F, while over the path of movement of the strip 1 provided with mould halves a number of injection nozzles 17 is arranged, of course at the pitch distance S of the conductor pattern 2. It will be clear that in these mould halves also riser openings are provided at a suitable place. The strip including crystals with leads can be fed from a supply reel to a station not shown, for fitting the mould halves, can subsequently be transported further to the injection moulding device, after which the thus encapsulated crystals can be wound again on a reel. A considerable advantage of such a process with respect to the process known so far consists in that the encapsulating material in the permanent enclosure formed by the mould halves 8, 11 can solidify and that this need no longer take place in the mould, owing to which a considerably higher rate of production can be achieved and further automation of successive operations in line is possible.

I claim:

1. A method of producing encapsulated microelectronic elements each having wire leads, said method comprising the steps of: providing a strip composed of plural segments each of which has multiple conductors thereon; applying a microelectronic element to each of said segments and connecting said wire leads of each of said elements to selected ones of said conductors in the segment to which the microelectronic element is applied; detachably affixing first and second, prefabricated, cavitied members to each other on opposite sides of each segment in face-to-face relationship to form an envelope receiving the microelectronic element on the segment and also the portions of said conductors that are connected to the wire leads of the microelectronic element on the segment, such that (a) the assembly of (i) the microelectronic element, (ii) the lead wires of the microelectronic element, and (iii) said portions of the conductors on the segment is suspended in said envelope in spaced relation from the interior wall surfaces of said envelope and (b) the terminal ends of the conductors on the segment protrude from said envelope, subsequently both encapsulating said assembly and permanently affixing the pair of cavitated, envelope-forming members to their associated segment and to each other by (a) introducing a moldable synthetic material into said envelope to fill said envelope in peripheral surrounding relation to said assembly and (b) curing the moldable synthetic material in said envelope.

2. A method of producing encapsulated microelectronic elements as defined in claim 1 in which one of each pair of cooperating, envelope forming members has fastener means protruding from opposite ends thereof, wherein there are cooperating fastener means in the other of said members with which said first-mentioned fastener means can be engaged, and wherein the cooperating members are affixed on opposite sides of the associated segment in a relationship as aforesaid by inserting the fastener means of said one member through cooperating, alignment providing apertures in said segment and displacing the cooperating members relatively toward each other until both abut said segment and the fastener means of said members are engaged.

3. A method of producing encapsulated microelectronic elements as defined in either of the preceding claims 1 or 2 in which the envelope forming members are filled by feeding said strip after said members having been positioned relative to the segments thereof as aforesaid to a station having injection molding devices with a spacing therebetween equalling that between like locations of adjacent segments and there injecting said plastic material into said members.

4. An encapsulated microelectronic element produced by the method defined in claim 3.

5. An encapsulated microelectronic element produced by a method as defined in either of the preceding claims 1 or 2.

* * * * *